(12) United States Patent
Takeaki et al.

(10) Patent No.: US 10,790,151 B2
(45) Date of Patent: Sep. 29, 2020

(54) SUBSTRATE PROCESSING APPARATUS AND SUBSTRATE PROCESSING METHOD

(71) Applicant: SCREEN Holdings Co., Ltd., Kyoto (JP)

(72) Inventors: Rei Takeaki, Kyoto (JP); Masayuki Hayashi, Kyoto (JP); Takashi Ota, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 16/219,967

(22) Filed: Dec. 14, 2018

(65) Prior Publication Data

US 2019/0228989 A1 Jul. 25, 2019

(30) Foreign Application Priority Data

Jan. 23, 2018 (JP) .................. 2018-008691

(51) Int. Cl.
*H01L 21/306* (2006.01)
*H01L 21/67* (2006.01)
(Continued)

(52) U.S. Cl.
CPC ...... *H01L 21/30604* (2013.01); *H01L 21/302* (2013.01); *H01L 21/306* (2013.01); *H01L 21/31111* (2013.01); *H01L 21/6708* (2013.01); *H01L 21/6715* (2013.01); *H01L 21/6719* (2013.01); *H01L 21/67028* (2013.01); *H01L 21/67051* (2013.01); *H01L 21/67115* (2013.01); *H01L 21/67248* (2013.01)

(58) Field of Classification Search
None
See application file for complete search history.

(56) References Cited

U.S. PATENT DOCUMENTS 5,445,986 A 8/1995 Hirota
9,543,162 B2 1/2017 Hinode et al.
(Continued)

FOREIGN PATENT DOCUMENTS

JP 2015115455 6/2015
JP 2015135943 7/2015
(Continued)

OTHER PUBLICATIONS

K. Lee and S. Raghavan, "Etch Rate of Silicon and Silicon Dioxide in Ammonia-Peroxide Solutions Measured by Quartz Crystal Microbalance Technique", Electrochemical and Solid-State Letters, vol. 2, pp. 172-174. (Year: 1999).*

*Primary Examiner* — Jiong-Ping Lu
(74) *Attorney, Agent, or Firm* — JCIPRNET

(57) ABSTRACT

Provided is a substrate processing method for processing a substrate. The substrate processing method includes a step of processing the substrate with a phosphoric acid liquid, a step of processing the substrate with a rinsing liquid, and a step of processing the substrate with a chemical liquid containing ammonia. After the substrate is processed with the rinsing liquid, the step of processing the substrate with a chemical liquid removes a portion of thickness of a film in a depth direction of a phosphorus diffusion region from the phosphorus diffusion region formed in the substrate when the substrate is processed with the phosphoric acid liquid.

7 Claims, 11 Drawing Sheets

(51) Int. Cl.
*H01L 21/311* (2006.01)
*H01L 21/302* (2006.01)

(56) References Cited

U.S. PATENT DOCUMENTS

| | | |
|---|---|---|
| 2015/0093906 A1 | 4/2015 | Kobayashi et al. |
| 2015/0162224 A1* | 6/2015 | Hinode .............. H01L 29/6653 |
| | | 438/751 |
| 2016/0049308 A1 | 2/2016 | Hinode et al. |

FOREIGN PATENT DOCUMENTS

| | | |
|---|---|---|
| KR | 950010086 | 4/1995 |
| KR | 20170121121 | 11/2017 |

* cited by examiner

SUBSTRATE PROCESSING APPARATUS AND SUBSTRATE PROCESSING METHOD

CROSS-REFERENCE TO RELATED APPLICATION

This application claims priority under Article 119 of the US Patent Law on Japanese Patent Application No. 2018-008691, filed Jan. 23, 2018, the content of which is incorporated herein by reference in its entirety.

BACKGROUND

Technical Field

The disclosure relates to a substrate processing apparatus and a substrate processing method.

Description of Related Art

A substrate processing apparatus for processing a substrate is known. For example, a semiconductor substrate including semiconductor films, insulating films, and conductive members are processed by a substrate processing apparatus. In a semiconductor substrate, a nitride film is frequently used as an insulating film, and processing such as cleaning and/or etching is performed on the nitride film.

For example, it is known that a nitride film of a silicon substrate is processed using an etchant containing phosphoric acid. In that case, the phosphoric acid is regenerated by mixing the used etchant containing phosphoric acid and a hydrofluoric acid solution.

SUMMARY

According to one aspect of the disclosure, a substrate processing method is for processing a substrate. The substrate processing method includes a step of processing the substrate with a phosphoric acid liquid, a step of processing the substrate with a rinsing liquid after the substrate has been processed with the phosphoric acid liquid, and a step of processing the substrate with a chemical liquid containing ammonia after the substrate has been processed with the rinsing liquid so that a portion of thickness of a film in a depth direction of a phosphorus diffusion region is removed from the phosphorus diffusion region formed in the substrate when the substrate is processed with the phosphoric acid liquid.

According to another aspect of the disclosure, a substrate processing apparatus processes a substrate. The substrate processing apparatus includes a phosphoric acid liquid supply device, a rinsing liquid supply device, a chemical liquid supply device, and a control unit. The phosphoric acid liquid supply device supplies a phosphoric acid liquid to the substrate. The rinsing liquid supply device supplies a rinsing liquid to the substrate. The chemical liquid supply device supplies a chemical liquid containing ammonia to the substrate. The control unit is configured to control the phosphoric acid liquid supply device, the rinsing liquid supply device, and the chemical liquid supply device. The control unit is configured to control the phosphoric acid liquid supply device so that the phosphoric acid liquid supply device supplies the phosphoric acid liquid to the substrate to process the substrate with the phosphoric acid liquid. The control unit is configured to control the rinsing liquid supply device so that the rinsing liquid supply device supplies the rinsing liquid to the substrate to process the substrate with the rinsing liquid after the substrate has been processed with the phosphoric acid liquid. The control unit is configured to control the chemical liquid supply device so that the chemical liquid supply device supplies the chemical liquid to the substrate after the substrate has been processed with the rinsing liquid to remove a portion of thickness of a film in a depth direction of a phosphorus diffusion region from the phosphorus diffusion region formed in the substrate when the substrate is processed with the phosphoric acid liquid.

DESCRIPTION OF THE EMBODIMENTS

Figure 1:
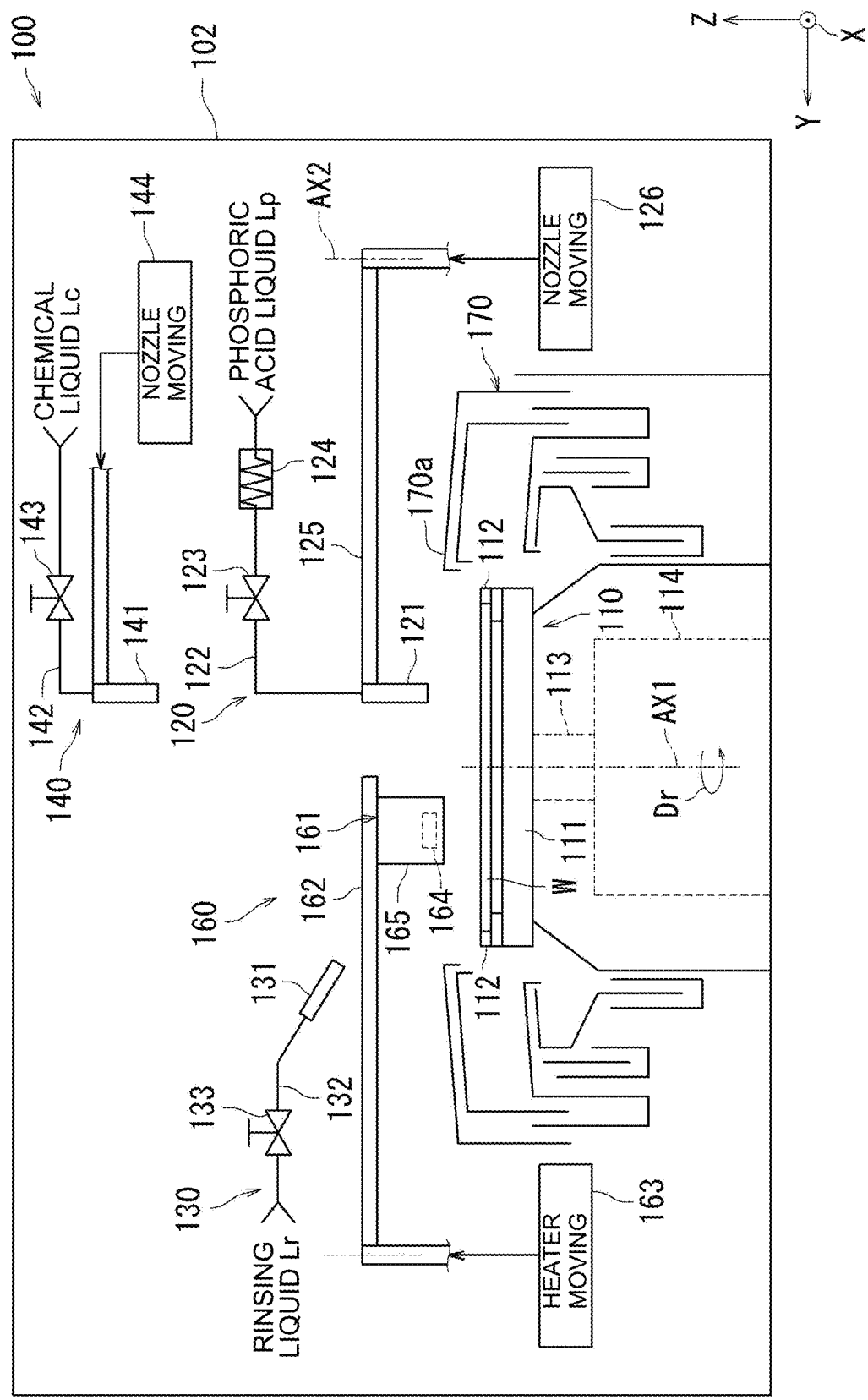
FIG. 1 is a schematic view illustrating a substrate processing apparatus of the present embodiment.

Hereinafter, embodiments of the disclosure will be described with reference to the drawings. In the following description, the same or corresponding portions in the drawings are denoted by the same reference signs, and the description thereof will not be repeated.

A substrate processing apparatus 100 of the present embodiment will be described with reference to FIG. 1. FIG. 1 is a schematic view of the substrate processing apparatus 100 of the present embodiment.

The substrate processing apparatus 100 processes a substrate W. The substrate processing apparatus 100 supplies a processing liquid to the substrate W and processes the substrate W with the processing liquid. Here, the substrate processing apparatus 100 processes the substrates W one at a time.

The substrate W includes, for example, semiconductor wafers, substrates for a liquid crystal display device, substrates for a plasma display, substrates for a field emission display (FED), substrates for an optical disc, substrates for a magnetic disk, substrates for a magneto-optical disc, substrates for a photomask, ceramic substrates, substrates for a solar cell, and the like. For example, the substrate W is formed in a substantially disc shape.

For example, the substrate W may be made of silicon. The substrate W may have a silicon nitride film. Further, the substrate W preferably has a silicon nitride film and a silicon oxide film.

The substrate processing apparatus 100 includes a chamber 102, a spin chuck 110, a phosphoric acid liquid supply device 120, a rinsing liquid supply device 130, and a chemical liquid supply device 140. The chamber 102 is formed in a substantially box shape having an internal space. The spin chuck 110, the phosphoric acid liquid supply device 120, the rinsing liquid supply device 130, and the chemical liquid supply device 140 are accommodated in the chamber 102.

In addition, the chamber 102 accommodates the substrate W. Here, the substrate processing apparatus 100 is of a single-wafer-processing type that processes the substrates W one at a time, and the substrates W are accommodated one at a time in the chamber 102. The substrate W is accommodated in the chamber 102 and processed in the chamber 102.

The spin chuck 110 holds the substrate W. Also, the spin chuck 110 rotates the substrate W with the substrate W held.

The phosphoric acid liquid supply device 120 supplies a phosphoric acid liquid Lp to the substrate W. When the phosphoric acid liquid Lp is supplied to the substrate W, the substrate W is processed with the phosphoric acid liquid. The phosphoric acid liquid Lp is, for example, an aqueous solution containing phosphoric acid as a main component. A concentration of phosphoric acid in the phosphoric acid liquid Lp is preferably 50% or more, more preferably 65% or more, and still more preferably 80% or more. However, a concentration of phosphoric acid in the phosphoric acid liquid Lp may be appropriately regulated as needed.

When the substrate W is processed with the phosphoric acid liquid Lp, the substrate W is etched. Particularly, a silicon nitride film of the substrate W is etched by processing with the phosphoric acid liquid. When the substrate W is processed with the phosphoric acid liquid Lp, if there is a silicon oxide film on the substrate W, the silicon oxide film may be etched together with the silicon nitride film by the phosphoric acid liquid Lp. When the substrate W is processed with the phosphoric acid liquid Lp, if there is a polysilicon film on the substrate W, the polysilicon film may be etched together with the silicon nitride film by the phosphoric acid liquid Lp.

Typically, an etching selectivity of the phosphoric acid liquid Lp (an etching depth of a silicon nitride film/an etching depth of a silicon oxide film, and an etching depth of a silicon nitride film/an etching depth of a polysilicon film) decreases in inverse proportion as a concentration of the phosphoric acid liquid Lp increases. Therefore, when a silicon nitride film is etched with a high etching selectivity, it is preferable that a concentration of the phosphoric acid liquid Lp be relatively low. For example, when a concentration of phosphoric acid in the phosphoric acid liquid Lp is 85% or less, the silicon nitride film can be etched with a high etching selectivity.

The rinsing liquid supply device 130 supplies a rinsing liquid Lr to the substrate W. When the rinsing liquid Lr is supplied to the substrate W, the substrate W is rinsed. The rinsing liquid Lr may be, for example, pure water (deionized water). Further, the rinsing liquid Lr is not limited to pure water, and may be any one of carbonated water, electrolyzed ionic water, hydrogen water, ozone water, isopropyl alcohol (IPA), and hydrochloric acid water at a diluted concentration (for example, about 10 to 100 ppm).

The chemical liquid supply device 140 supplies a chemical liquid Lc to the substrate W. When the chemical liquid Lc is supplied to the substrate W, the substrate W is processed with the chemical liquid. The chemical liquid Lc contains ammonia. For example, the chemical liquid Lc contains a mixed liquid of ammonia water and hydrogen peroxide water (a mixed liquid containing $NH_4OH$ and $H_2O_2$ (SC1)). Alternatively, the chemical liquid Lc may be a liquid containing ammonium hydroxide ($NH_4OH$).

The substrate W is etched by the chemical liquid Lc containing ammonia. Particularly, a silicon oxide film of the substrate W is etched by the chemical liquid Lc. Further, when the substrate W is processed with the chemical liquid Lc containing ammonia, a protective film Pf is formed on the processed substrate W. As will be described in detail below, deterioration in characteristics of the substrate W can be inhibited by the protective film Pf.

A temperature of the chemical liquid Lc is preferably higher than room temperature. For example, a temperature of the chemical liquid Lc is preferably 60° C. or more and 80° C. or less. When a temperature of the chemical liquid Lc is higher than room temperature, a processing time of the chemical liquid processing can be curtailed. However, a temperature of the chemical liquid Lc may be room temperature, or a temperature of the chemical liquid Lc may be lower than room temperature.

As illustrated in FIG. 1, it is preferable that the substrate processing apparatus 100 further include a heating device 160. The heating device 160 heats the substrate W.

Also, as illustrated in FIG. 1, it is preferable that the substrate processing apparatus 100 further include a cup 170. At least one of the phosphoric acid liquid Lp, the rinsing liquid Lr, and the chemical liquid Lc supplied to the substrate W can be recovered using the cup 170. Details of the configuration of the substrate processing apparatus 100 will be described below.

Figure 2:
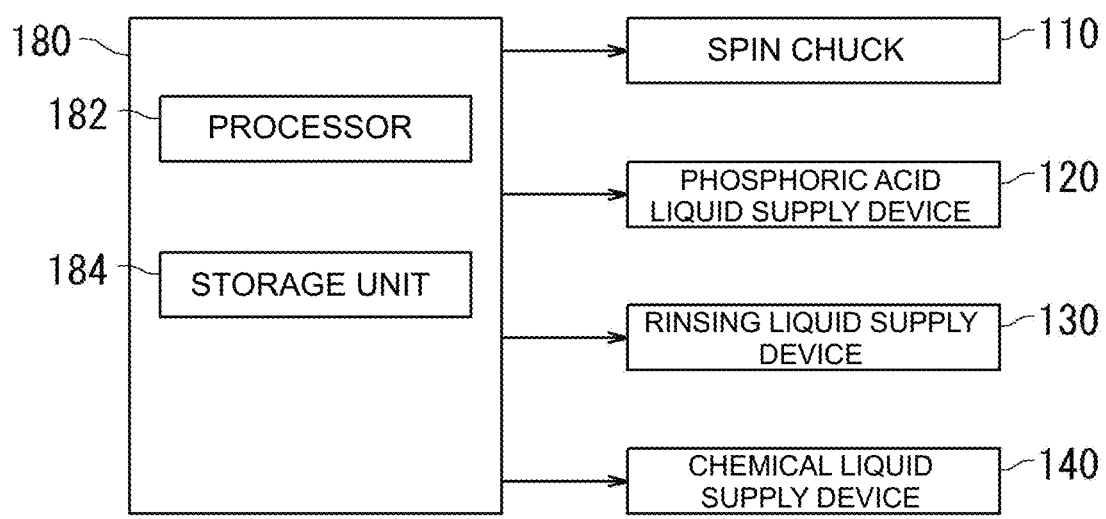
FIG. 2 is a block diagram of the substrate processing apparatus of the present embodiment.

Next, the substrate processing apparatus 100 of the present embodiment will be described with reference to FIGS. 1 and 2. FIG. 2 is a block diagram of the substrate processing apparatus 100. The substrate processing apparatus 100 further includes a control unit 180. The control unit 180 controls the spin chuck 110, the phosphoric acid liquid supply device 120, the rinsing liquid supply device 130, and the chemical liquid supply device 140.

The control unit 180 includes a processor 182 and a storage unit 184. The processor 182 includes, for example, a central processing unit (CPU). Alternatively, the processor 182 may include a general-purpose calculator.

The storage unit 184 stores data and computer programs. The storage unit 184 includes a main storage device and an auxiliary storage device. The main storage device may be, for example, a semiconductor memory. The auxiliary storage device may be, for example, a semiconductor memory and/or a hard disk drive. The storage unit 184 may include removable media. The processor 182 executes computer programs stored in the storage unit 184 and thereby executes a substrate processing method.

Figure 3:
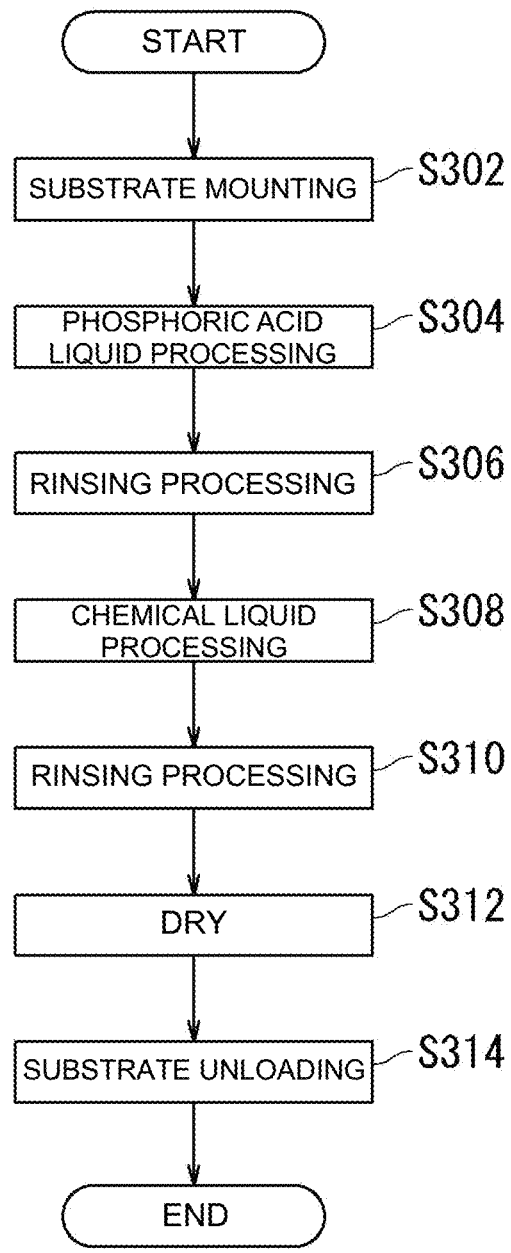
FIG. 3 is a flowchart showing a substrate processing method executed by the substrate processing apparatus illustrated in FIG. 1.

Here, a substrate processing method of executing the substrate processing apparatus 100 of the present embodiment will be described with reference to FIGS. 1 to 3. FIG. 3 is a flowchart showing a substrate processing method of the present embodiment. As illustrated in FIG. 3, the substrate processing method of the present embodiment includes steps S302 to S314.

As shown in step S302, the substrate W is mounted on the substrate processing apparatus 100. First, the substrate W is accommodated in the chamber 102. The substrate W has a silicon nitride film, and the silicon nitride film is exposed on a surface of the substrate W. Typically, the substrate W has a silicon nitride film and a silicon oxide film, and the silicon nitride film and the silicon oxide film are exposed on the surface of the substrate W. The substrate W is placed on the spin chuck 110, and the spin chuck 110 holds the substrate W.

As shown in step S304, the substrate W is processed with the phosphoric acid liquid Lp. Before the phosphoric acid liquid Lp is supplied to the substrate W, the spin chuck 110 holds the substrate W and rotates the substrate W. For example, the control unit 180 controls the spin chuck 110 such that the spin chuck 110 holds the substrate W and rotates the substrate W. The substrate W is rotated until a rotational speed reaches about 100 rpm. Thereafter, the control unit 180 controls the phosphoric acid liquid supply device 120 such that the phosphoric acid liquid supply device 120 supplies the phosphoric acid liquid Lp to the substrate W to process the substrate W with the phosphoric acid liquid.

The silicon nitride film of the substrate W is etched by the supply of the phosphoric acid liquid Lp. When a silicon nitride film and a silicon oxide film have been provided on the substrate W, the silicon nitride film and the silicon oxide film of the substrate W are etched by the phosphoric acid liquid Lp. As will be described below in detail, when the substrate W is processed with the phosphoric acid liquid Lp, a phosphorus diffusion region PD in which phosphorus is diffused is formed near the surface of the substrate W.

Due to the phosphoric acid liquid processing, the phosphorus diffusion region PD in which phosphorus is diffused is formed near the surface of the substrate W. A depth of the phosphorus diffusion region PD and a degree of the phosphorus diffusion change depending on a concentration of the phosphoric acid liquid Lp, a processing time of the phosphoric acid liquid, a temperature of the phosphoric acid liquid processing, and the like. For example, a depth of the phosphorus diffusion region PD may be 0.5 nm. Further, a depth of the phosphorus diffusion region PD may be 0.4 nm or 0.3 nm.

As shown in step S306, the substrate W having been processed with the phosphoric acid liquid is processed with the rinsing liquid Lr. When the substrate W is processed with the rinsing liquid Lr, phosphoric acid on the surface of the substrate W can be removed. The control unit 180 controls the rinsing liquid supply device 130 such that the rinsing liquid supply device 130 supplies the rinsing liquid Lr to the substrate W to perform rinsing processing of the substrate W. The phosphoric acid liquid Lp is forced to flow toward an outer side of the substrate W due to the rinsing liquid Lr and discharged around the substrate W. Therefore, a liquid film of the phosphoric acid liquid Lp on the substrate W is replaced with a liquid film of the rinsing liquid Lr covering the entire upper surface region of the substrate W.

A temperature of the rinsing liquid Lr is preferably higher than room temperature. For example, the temperature of the rinsing liquid Lr may be 60° C. or more and 80° C. or less. When a temperature of the rinsing liquid Lr is higher than room temperature, a processing time of a chemical liquid processing in step S308 to be described below can be curtailed. However, a temperature of the rinsing liquid Lr may be room temperature.

Further, it is preferable that the rinsing processing shown in step S306 be started immediately after the phosphoric acid liquid processing shown in step S304. By supplying the rinsing liquid Lr before the phosphoric acid liquid Lp dries on the substrate W, phosphorus can be removed before the phosphorus in the phosphoric acid liquid Lp is fixed to the substrate W.

As described above, the phosphoric acid liquid Lp on the surface of the substrate W can be removed by the rinsing processing. On the other hand, although details will be described below, the phosphorus in the phosphorus diffusion region PD cannot be sufficiently removed despite the rinsing processing.

As shown in step S308, the substrate W is processed with the chemical liquid Lc containing ammonia. The control unit 180 controls the chemical liquid supply device 140 such that the chemical liquid supply device 140 supplies the chemical liquid Lc to the substrate W to process the substrate W with the chemical liquid.

The chemical liquid processing is performed such that a film of an upper portion in a depth direction of the phosphorus diffusion region PD is removed from the phosphorus diffusion region PD using the chemical liquid Lc while leaving a film below the phosphorus diffusion region PD. For example, a film with a thickness of less than 0.3 nm is removed from the surface of the substrate W in the chemical liquid processing. When the substrate W is processed with the chemical liquid Lc containing ammonia, the protective film Pf is formed on the processed substrate W. Deterioration in characteristics of the substrate W can be inhibited by the protective film Pf.

A temperature of the chemical liquid Lc is preferably higher than room temperature. For example, a temperature of the chemical liquid Lc is preferably 60° C. or more and 80° C. or less. When a temperature of the chemical liquid Lc is higher than room temperature, a processing time of the chemical liquid processing can be curtailed. However, a temperature of the chemical liquid Lc may be room temperature, or a temperature of the chemical liquid Lc may be lower than room temperature.

As shown in step S310, the substrate W having been processed with the chemical liquid is processed with the rinsing liquid Lr. The control unit 180 controls the rinsing liquid supply device 130 such that the rinsing liquid supply device 130 supplies the rinsing liquid Lr to the substrate W to perform rinsing processing of the substrate W. The chemical liquid Lc is forced to flow toward an outer side of the substrate W due to the rinsing liquid Lr and discharged around the substrate W. Therefore, a liquid film of the chemical liquid Lc on the substrate W is replaced with a liquid film of the rinsing liquid Lr covering the entire upper surface region of the substrate W.

A temperature of the rinsing liquid Lr is preferably higher than room temperature. For example, a temperature of the rinsing liquid Lr is preferably 60° C. or more and 80° C. or less. However, a temperature of the rinsing liquid Lr may be room temperature. Further, the rinsing liquid Lr with respect to the chemical liquid Lc may be different from the rinsing liquid Lr used for the substrate W processed with the phosphoric acid liquid Lp. Also, the rinsing processing shown in step S310 may be different from the rinsing processing shown in step S306.

As shown in step S312, the substrate W is dried. The control unit 180 controls the spin chuck 110 such that a speed at which the substrate W is rotated by the spin chuck 110 is higher than a rotation speed at the time of steps S304 to S310. For example, the rotation speed of the substrate W when the substrate W is dried may be 500 rpm or more and 3000 rpm or less. In this case, a large centrifugal force is applied to the rinsing liquid Lr on the substrate W, and the rinsing liquid Lr that has adhered to the substrate W is shaken off around the substrate W. In this manner, the rinsing liquid Lr is removed from the substrate W, and the substrate W can be dried. For example, the control unit 180 stops the rotation of the substrate W by the spin chuck 110 after elapse of a predetermined time from the start of the high-speed rotation of the substrate W.

Next, as shown in step S314, the substrate W is unloaded from the chamber 102. When the control unit 180 releases the holding of the substrate W by the spin chuck 110, the substrate W can be unloaded from the chamber 102. The substrate processing method of the present embodiment is executed as described above.

According to the substrate processing method of the present embodiment, since a film of an upper portion in a depth direction of the phosphorus diffusion region PD is removed from the phosphorus diffusion region PD of the substrate W using the chemical liquid Lc while leaving a film below the phosphorus diffusion region PD of the substrate W, a thickness of the film to be removed from the substrate W can be reduced. Also, according to the substrate processing method of the present embodiment, since the chemical liquid processing is performed using the chemical liquid Lc containing ammonia, the protective film Pf can be formed on the surface of the substrate W and deterioration in characteristics of the substrate can be inhibited.

Further, the protective film Pf may be removed after the protective film Pf is formed on the surface of the substrate W by the chemical liquid processing. However, an interval from the removal of the protective film Pf to a start of the next processing on the substrate W is preferably short. For example, it is preferable that the interval from the removal of the protective film Pf to a start of the next processing on the substrate W be within 48 hours, and more preferably within 24 hours. Also, when a time is required until a start of the next processing after the removal of the protective film Pf, it is preferable that a state in which the protective film Pf is formed on the substrate of the substrate W be maintained without removing the protective film Pf until immediately before a start of the next processing.

Figure 4A:
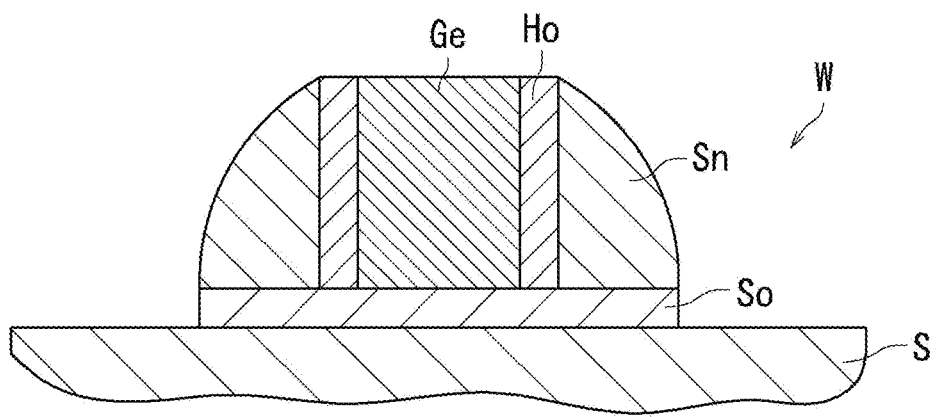
FIG. 4A is a schematic view illustrating a substrate before being processed with a phosphoric acid liquid.
Figure 4B:
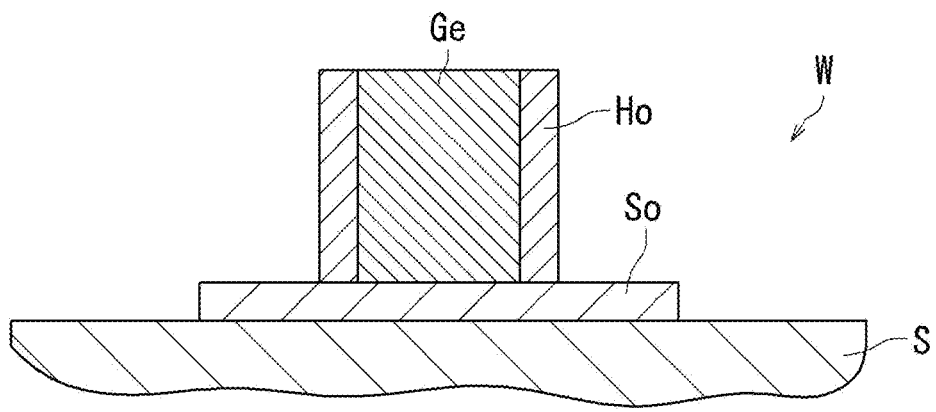
FIG. 4B is a schematic view illustrating the substrate after being processed with the phosphoric acid liquid.

Here, a change of the substrate W due to the phosphoric acid liquid processing shown in step S304 of FIG. 3 will be described with reference to FIGS. 4A and 4B. FIG. 4A is a schematic view illustrating the substrate W before being processed with the phosphoric acid liquid, and FIG. 4B is a schematic view illustrating the substrate W after being processed with the phosphoric acid liquid.

As illustrated in FIG. 4A, a silicon oxide film So, a gate electrode Ge, a thermal oxide film Ho, and a silicon nitride film Sn are provided on a base substrate S on the substrate W before the phosphoric acid liquid processing. For example, the base substrate S may be formed of silicon. The silicon oxide film So is formed from tetraethyl orthosilicate (TEOS). The gate electrode Ge is formed of polysilicon. The thermal oxide film Ho is formed of silicon oxide. Further, the thermal oxide film Ho is formed by oxidizing polysilicon of the gate electrode Ge by heat treatment. For example, the silicon nitride film Sn is formed of SiN or $Si_3N_4$.

Specifically, the silicon oxide film So is provided on the base substrate S. Further, the gate electrode Ge, the thermal oxide film Ho, and the silicon nitride film Sn are provided on the silicon oxide film So. More specifically, the gate electrode Ge is disposed at a center on the silicon oxide film So. A side surface of the gate electrode Ge is surrounded by the thermal oxide film Ho. A thickness in a lateral direction of the thermal oxide film Ho is several nanometers to tens of nanometers. The silicon nitride film Sn is provided on a lateral side of the thermal oxide film Ho. Further, the silicon oxide film So is positioned beneath the gate electrode Ge, and the silicon oxide film So functions as a gate oxide film.

In the phosphoric acid liquid processing, the phosphoric acid liquid supply device 120 supplies the phosphoric acid liquid Lp to the substrate W, and thereby the silicon nitride film Sn is etched. At this time, a concentration of phosphoric acid in the phosphoric acid liquid Lp is preferably low. For example, a concentration of phosphoric acid in the phosphoric acid liquid Lp is preferably 85% or less.

Further, a processing time of the phosphoric acid liquid processing is set to such a time in which substantially all the silicon nitride film Sn can be removed. When a predetermined processing time has elapsed, the phosphoric acid liquid processing ends.

When the phosphoric acid liquid processing ends, substantially all the silicon nitride film Sn is removed from the substrate W as illustrated in FIG. 4B. Further, when a concentration of the phosphoric acid liquid Lp is low, since $SiN/SiO_2$ selectivity and SiN/Poly-Si selectivity in the phosphoric acid liquid Lp are high, etching of the gate electrode Ge and the thermal oxide film Ho by the phosphoric acid liquid Lp can be inhibited in the step of the phosphoric acid solution processing.

The control unit 180 (FIG. 2) stops the supply of the phosphoric acid liquid Lp by the phosphoric acid liquid supply device 120 at the end of the phosphoric acid liquid processing. As a result of the phosphoric acid liquid processing, a configuration including the silicon oxide film So formed on the surface of the substrate W, the gate electrode Ge disposed on the silicon oxide film So, and the thermal oxide film Ho disposed on the lateral side of the gate electrode Ge can be obtained. As described above, the silicon nitride film Sn with respect to the silicon oxide film So can be selectively etched by the phosphoric acid liquid processing. As described above, the phosphoric acid liquid Lp can be suitably used for etching the silicon nitride film Sn.

Here, referring again to FIG. 1, the substrate processing apparatus 100 of the present embodiment will be described. The spin chuck 110 includes a spin base 111, a plurality of chuck pins 112, a rotating shaft 113, and a spin motor 114. Here, the spin base 111 is formed in a disc shape. The spin base 111 is held in a horizontal posture. Each of the plurality of chuck pins 112 holds the substrate W in a horizontal posture above the spin base 111. The rotating shaft 113 extends downward from a central portion of the spin base 111. The spin motor 114 rotates the substrate W and the spin base 111 around a rotation axis AX1 by rotating the rotating shaft 113 in a rotational direction Dr.

Further, the spin chuck 110 is not limited to a clamping type chuck by which the plurality of chuck pins 112 are brought into contact with a circumferential end surface of the substrate W. The spin chuck 110 may be a vacuum type chuck by which a rear surface (lower surface) of the substrate W, which is a non-device forming surface, is adsorbed to an upper surface of the spin base 111 so that the substrate W is horizontally held.

As illustrated in FIG. 1, the phosphoric acid liquid supply device 120 includes a phosphoric acid liquid nozzle 121, a phosphoric acid liquid pipe 122, a phosphoric acid liquid valve 123, and a phosphoric acid liquid temperature regulating device 124. The phosphoric acid liquid nozzle 121 discharges the phosphoric acid liquid Lp toward the substrate W held by the spin chuck 110. The phosphoric acid liquid pipe 122 supplies the phosphoric acid liquid Lp to the phosphoric acid liquid nozzle 121. The phosphoric acid liquid valve 123 switches between allowing supply and stopping supply of the phosphoric acid liquid Lp from the phosphoric acid liquid pipe 122 to the phosphoric acid liquid nozzle 121. The phosphoric acid liquid temperature regulating device 124 raises a temperature of the phosphoric acid liquid Lp supplied to the phosphoric acid liquid nozzle 121 to a temperature higher than room temperature.

When the phosphoric acid liquid valve 123 is open, the phosphoric acid liquid Lp of which a temperature has been regulated by the phosphoric acid liquid temperature regulating device 124 is supplied from the phosphoric acid liquid pipe 122 to the phosphoric acid liquid nozzle 121, and is discharged from the phosphoric acid liquid nozzle 121. The phosphoric acid liquid temperature regulating device 124 maintains a temperature of the phosphoric acid liquid Lp, for example, at a constant temperature in a range of 80 to 215° C. The temperature of the phosphoric acid liquid Lp regulated by the phosphoric acid liquid temperature regulating device 124 may be a boiling point at the concentration or a temperature lower than the boiling point. The phosphoric acid liquid Lp is, for example, an aqueous solution containing phosphoric acid as a main component. A concentration of phosphoric acid in the phosphoric acid liquid Lp may be, for example, in a range of 50% to 100%, and is preferably around 80%.

The phosphoric acid liquid supply device 120 includes a nozzle arm 125 and a phosphoric acid liquid nozzle moving device 126. The phosphoric acid liquid nozzle 121 is attached to a distal end portion of the nozzle arm 125. The phosphoric acid liquid nozzle moving device 126 rotates the nozzle arm 125 around a rotation axis AX2 extending in a vertical direction at a periphery of the spin chuck 110 and moves the nozzle arm 125 in a vertical direction along the rotation axis AX2. As a result, the phosphoric acid liquid nozzle moving device 126 moves the phosphoric acid liquid nozzle 121 in a horizontal direction and/or in a vertical direction. Further, the phosphoric acid liquid nozzle moving device 126 moves the phosphoric acid liquid nozzle 121 in a horizontal direction between a processing position at which the phosphoric acid liquid Lp discharged from the phosphoric acid liquid nozzle 121 is supplied to an upper surface of the substrate W and a retreat position at which the phosphoric acid liquid nozzle 121 has retreated to a periphery of the substrate W in a plan view.

The rinsing liquid supply device 130 includes a rinsing liquid nozzle 131, a rinsing liquid pipe 132, and a rinsing liquid valve 133. The rinsing liquid nozzle 131 discharges the rinsing liquid Lr toward the substrate W held by the spin chuck 110. The rinsing liquid nozzle 131 is a fixed nozzle that discharges the rinsing liquid Lr in a state in which a discharge port of the rinsing liquid nozzle 131 is stationary. The rinsing liquid pipe 132 supplies the rinsing liquid Lr to the rinsing liquid nozzle 131. The rinsing liquid valve 133 switches between allowing supply and stopping supply of the rinsing liquid Lr from the rinsing liquid pipe 132 to the rinsing liquid nozzle 131.

When the rinsing liquid valve 133 is open, the rinsing liquid Lr supplied from the rinsing liquid pipe 132 to the rinsing liquid nozzle 131 is discharged from the rinsing liquid nozzle 131 toward a central portion of the upper surface of the substrate W. Further, the rinsing liquid supply device 130 may include a rinsing liquid nozzle moving device. The rinsing liquid nozzle moving device can move a discharge position of the rinsing liquid Lr with respect to the upper surface of the substrate W by moving the rinsing liquid nozzle 131.

The chemical liquid supply device 140 includes a chemical liquid nozzle 141, a chemical liquid pipe 142, a chemical liquid valve 143, and a chemical liquid nozzle moving device 144. The chemical liquid nozzle 141 discharges the chemical liquid Lc toward the substrate W held by the spin chuck 110. The chemical liquid Lc contains SC1. The chemical liquid pipe 142 supplies the chemical liquid Lc to the chemical liquid nozzle 141. The chemical liquid valve 143 switches between allowing supply and stopping supply of the chemical liquid Lc from the chemical liquid pipe 142 to the chemical liquid nozzle 141. When the chemical liquid valve 143 is open, the chemical liquid Lc is supplied from the chemical liquid pipe 142 to the chemical liquid nozzle 141, and is discharged from the chemical liquid nozzle 141.

The chemical liquid nozzle moving device 144 moves the chemical liquid nozzle 141 in a horizontal direction and/or in a vertical direction. The chemical liquid nozzle moving device 144 moves the chemical liquid nozzle 141 in a horizontal direction between a processing position at which the chemical liquid Lc discharged from the chemical liquid nozzle 141 is supplied to the upper surface of the substrate W and a retreat position at which the chemical liquid nozzle 141 has retreated to a periphery of the substrate W in a plan view.

The heating device 160 includes an infrared heater 161, a heater arm 162, and a heater moving device 163. The infrared heater 161 irradiates the substrate W with infrared rays. The infrared heater 161 is attached to a distal end portion of the heater arm 162. The heater moving device 163 moves the heater arm 162.

The infrared heater 161 includes an infrared lamp 164 and a lamp housing 165. The infrared lamp 164 emits infrared rays. The lamp housing 165 houses the infrared lamp 164. The infrared lamp 164 is disposed in the lamp housing 165. The lamp housing 165 is smaller than the substrate W in a plan view. Therefore, the infrared heater 161 is smaller than the substrate W in a plan view. The infrared lamp 164 and the lamp housing 165 are attached to the heater arm 162. Accordingly, the infrared lamp 164 and the lamp housing 165 move together with the heater arm 162.

As illustrated in FIG. 1, the cup 170 is disposed on an outer side (in a direction away from the rotation axis AX1) of the substrate W held by the spin chuck 110. The cup 170 has a substantially cylindrical shape. The cup 170 surrounds the spin base 111. The cup 170 receives a processing liquid discharged from the substrate W.

When a processing liquid is supplied to the substrate W in a state in which the spin chuck 110 is rotating the substrate W, the processing liquid supplied to the substrate W is shaken off around the substrate W. When the processing liquid is supplied to the substrate W, an upper end portion 170a of the cup 170 which opens upward is disposed above the spin base 111. Therefore, the processing liquid such as the chemical liquid, the rinsing liquid, or the like discharged around the substrate W is received by the cup 170. Then, the processing liquid received by the cup 170 is sent to a recovery device or a waste liquid device (not illustrated).

Further, the chemical liquid supply device 140 discharges the chemical liquid Lc from the chemical liquid nozzle 141 in the above description with reference to FIG. 1, but the present embodiment is not limited thereto. The chemical liquid Lc may be mixed with a gas and supplied to the substrate W in a spray pattern. Alternatively, the chemical liquid Lc may be supplied to the substrate W from the chemical liquid nozzle 141 of the chemical liquid supply device 140 and may also be supplied to the substrate W in a spray pattern.

Further, in the substrate processing apparatus 100 described above with reference to FIGS. 1 to 3 and FIGS. 4A and 4B, the phosphoric acid liquid supply device 120, the rinsing liquid supply device 130, and the chemical liquid supply device 140 are disposed in the chamber 102 as members for supplying liquids, but the present embodiment is not limited thereto. A supply device for supplying another liquid in addition to the phosphoric acid liquid supply device 120, the rinsing liquid supply device 130, and the chemical liquid supply device 140 may be disposed in the chamber 102.

Figure 5:
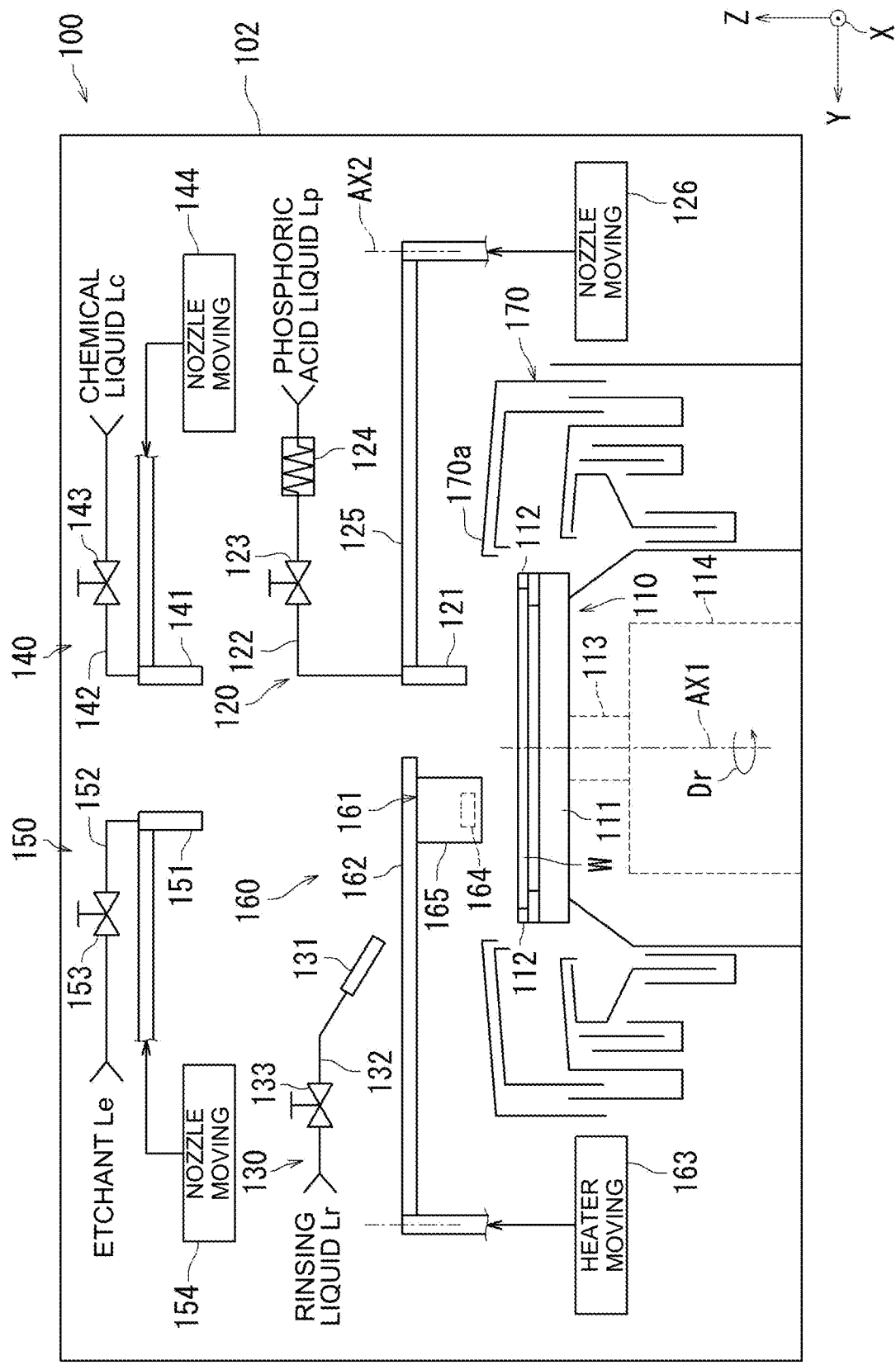
FIG. 5 is a schematic view illustrating the substrate processing apparatus of the present embodiment.

The substrate processing apparatus 100 of the present embodiment will be described with reference to FIG. 5. FIG. 5 is a schematic view of the substrate processing apparatus 100. The substrate processing apparatus 100 illustrated in FIG. 5 has the same configuration as that of the substrate processing apparatus 100 described above with reference to FIG. 1 except that an etchant supply device 150 is further provided. Therefore, duplicate description will be omitted for the purpose of avoiding redundant description.

The substrate processing apparatus 100 further includes the etchant supply device 150. The etchant supply device 150 supplies an etchant Le to the substrate W. The etchant Le can be used for etching the substrate W, for example. The control unit 180 (FIG. 2) controls the etchant supply device 150.

As described above, the chemical liquid Lc is a liquid containing ammonia, and the substrate W is etched when the chemical liquid Lc is supplied. However, the etchant Le is not the same as the chemical liquid Lc. An etching rate of the substrate W due to the etchant Le is different from an etching rate of the substrate W due to the chemical liquid Lc. For example, an etching rate of the substrate W due to the etchant Le is preferably higher than an etching rate of the substrate W due to the chemical liquid Lc. Thereby, an etching time of the substrate W can be curtailed.

Further, components of the etchant Le may be different from components of the chemical liquid Lc. For example, hydrofluoric acid may be used as the etchant Le. Since an etching rate of the hydrofluoric acid is higher than an etching rate of a liquid containing ammonia, an etching time of the substrate W can be curtailed.

Alternatively, materials contained in the etchant Le may be the same as materials contained in the chemical liquid Lc. However, even though materials contained in the etchant Le are the same as materials contained in the chemical liquid Lc, when a content in the etchant Le are different from a content in the chemical liquid Lc, an etching rate of the etchant Le can be made different from an etching rate of the chemical liquid Lc. For example, even when both the etchant Le and the chemical liquid Lc contain ammonia, an etching rate of the substrate W due to the etchant Le can be made higher than an etching rate of the substrate W due to the chemical liquid Lc by making an ammonia content of the etchant Le higher than an ammonia content of the chemical liquid Lc.

Alternatively, even when components and respective contents thereof in the etchant Le are the same as components and respective contents thereof in the chemical liquid Lc, an etching rate due to the etchant Le and an etching rate due to the chemical liquid Lc can be made different by making a temperature of the etchant Le and a temperature of the chemical liquid Lc different from each other. For example, even though components and respective contents thereof in the etchant Le are the same as components and respective contents thereof in the chemical liquid Lc, when a temperature of the etchant Le is higher than a temperature of the chemical liquid Lc an etching rate due to the etchant Le can be made higher than an etching rate due to the chemical liquid Lc.

The etchant supply device 150 includes an etchant nozzle 151, an etchant pipe 152, an etchant valve 153, and an etchant nozzle moving device 154. The etchant nozzle 151 discharges the etchant Le toward the substrate W held by the spin chuck 110. The etchant pipe 152 supplies the etchant Le to the etchant nozzle 151. The etchant valve 153 switches between allowing supply and stopping supply of the etchant Le from the etchant pipe 152 to the etchant nozzle 151. When the etchant valve 153 is open, the etchant Le is supplied from the etchant pipe 152 to the etchant nozzle 151, and is discharged from the etchant nozzle 151.

The etchant nozzle moving device 154 moves the etchant nozzle 151 in a horizontal direction and/or in a vertical direction. The etchant nozzle moving device 154 moves the etchant nozzle 151 in a horizontal direction between a processing position and a retreat position. When the etchant nozzle 151 has moved to the processing position, the etchant Le discharged from the etchant nozzle 151 is supplied to the upper surface of the substrate W. When the etchant nozzle 151 has moved to the retreat position, the etchant nozzle 151 has retreated to a periphery of the substrate W in a plan view.

Although not illustrated in FIG. 5, it is preferable that the etchant supply device 150 further include a temperature regulating device for regulating a temperature of the etchant Le. Thereby, a temperature of the etchant Le supplied to the etchant nozzle 151 can be raised to a temperature higher than room temperature.

Figure 6:
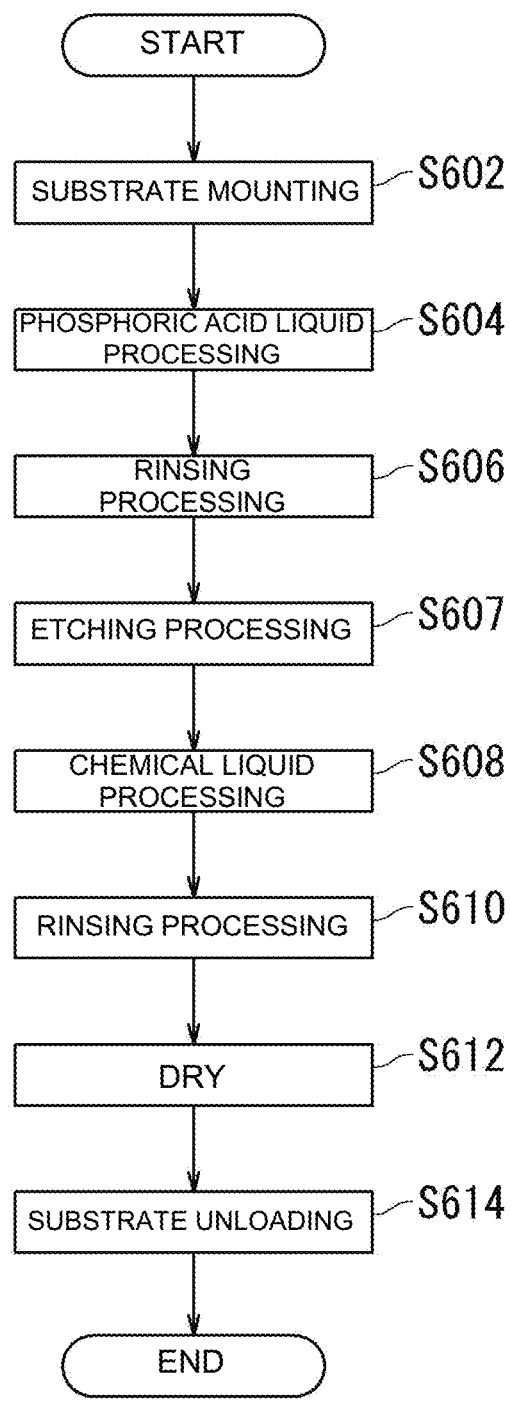
FIG. 6 is a flowchart showing a substrate processing method executed by the substrate processing apparatus illustrated in FIG. 5.

Next, a substrate processing method executed by the substrate processing apparatus 100 illustrated in FIG. 5 will be described with reference to FIGS. 2, 5, and 6. FIG. 6 is a flowchart showing a substrate processing method of the present embodiment. As shown in FIG. 6, the substrate processing method of the present embodiment includes steps S602 to S614. Further, the flowchart shown in FIG. 6 is the same as the flowchart described above with reference to FIG. 3 except that the step S607 for etching the substrate before the chemical liquid processing is added. Therefore, duplicate description will be omitted for the purpose of avoiding redundant description.

In the substrate processing method of the present embodiment, steps S602 to S606 are the same as steps S302 to S306 described above with reference to FIG. 3. The substrate W is mounted on the spin chuck 110 as shown in step S602, the substrate W is processed with the phosphoric acid liquid Lp as shown in step S604, and the substrate W is processed with the rinsing liquid Lr as shown in step S606.

Thereafter, the substrate W is processed with the etchant Le as shown in step S607. The control unit 180 controls the etchant supply device 150 such that the etchant supply device 150 supplies the etchant Le to the substrate W to perform etching processing of the substrate W.

Thereafter, the substrate W is processed with the chemical liquid Lc containing ammonia as shown in step S608. The step S608 is the same as the step S308 described above with reference to FIG. 3. The control unit 180 controls the chemical liquid supply device 140 such that the chemical liquid supply device 140 supplies the chemical liquid Lc to the substrate W to perform the chemical liquid processing of the substrate W. As described above, the substrate W is etched also in the chemical liquid processing. Further, subsequent steps S610 to S614 are the same as steps S310 to S314 described above with reference to FIG. 3. The substrate processing method of the present embodiment is executed as described above.

Further, an etching rate of the etching processing shown in step S607 is preferably higher than an etching rate of the chemical liquid processing shown in step S608. In this case, the control unit 180 (FIG. 2) controls the chemical liquid supply device 140 and the etchant supply device 150 such that an etching rate of the etching processing is higher than an etching rate of the chemical liquid processing.

For example, a liquid having an etching rate higher than that of the chemical liquid Lc may be selected as the etchant Le. Alternatively, an etching rate of the etchant Le may be made higher than an etching rate of the chemical liquid Lc by regulating a temperature of the etchant Le to be higher than a temperature of the chemical liquid Lc. In this manner, an etching rate of the etchant Le can be regulated to be higher than an etching rate of the chemical liquid Lc by selecting the etchant Le and/or regulating a temperature.

Alternatively, it is preferable that a thickness of a film removed from the substrate W in the etching processing shown in step S607 be larger than a thickness of a film removed from the substrate W in the chemical liquid processing shown in step S608. In this case, the control unit 180 (FIG. 2) controls the chemical liquid supply device 140 and the etchant supply device 150 such that a thickness of the film to be removed from the substrate W in the etching processing is larger than a thickness of the film to be removed from the substrate W in the chemical liquid processing.

For example, a liquid having an etching rate higher than that of the chemical liquid Lc may be selected as the etchant Le. Alternatively, an etching rate of the etchant Le may be made higher than an etching rate of the chemical liquid Lc by regulating a temperature of the etchant Le to be higher than a temperature of the chemical liquid Lc. Alternatively, a processing time of the etching processing may be made longer than a processing time of the chemical liquid processing. In this manner, a thickness of the film to be removed from the substrate W due to the etching processing can be regulated to be larger than a thickness of the film to be removed from the substrate W due to the chemical liquid processing by selecting the etchant Le, controlling a temperature, and/or regulating a processing time.

Alternatively, it is preferable that a temperature of the etchant Le in the etching processing shown in step S607 be higher than a temperature of the chemical liquid Lc in the chemical liquid processing shown in step S608. In this case, the control unit 180 (FIG. 2) controls the chemical liquid supply device 140 and the etchant supply device 150 such that a temperature of the etchant Le in the etching processing is higher than a temperature of the chemical liquid Lc in the chemical liquid processing. When a temperature of the etchant Le is higher than a temperature of the chemical liquid Lc, an etching rate in the etching processing can be made higher than an etching rate in the chemical liquid processing even when a composition of the etchant Le is the same as that of the chemical liquid Lc.

Further, although not shown in FIG. 6, a rinsing processing may be performed between the etching processing shown in step S607 and the chemical liquid processing shown in step S608. For example, the substrate W that has been subjected to the etching processing is processed with the rinsing liquid Lr. The control unit 180 controls the rinsing liquid supply device 130 such that the rinsing liquid supply device 130 supplies the rinsing liquid Lr to the substrate W to perform the rinsing processing of the substrate W.

As described above, the silicon nitride film Sn can be etched using the phosphoric acid liquid Lp. However, the inventors of the disclosure have found that, when a thickness of the film removed from the substrate W is simply reduced after the phosphoric acid liquid processing, there are cases in which characteristics of the substrate W are deteriorated. It is thought that residual phosphorus on the substrate W even though the substrate W is rinsed after the substrate W has been processed with the phosphoric acid liquid is the cause of deterioration in characteristics of the substrate W.

Figure 7:
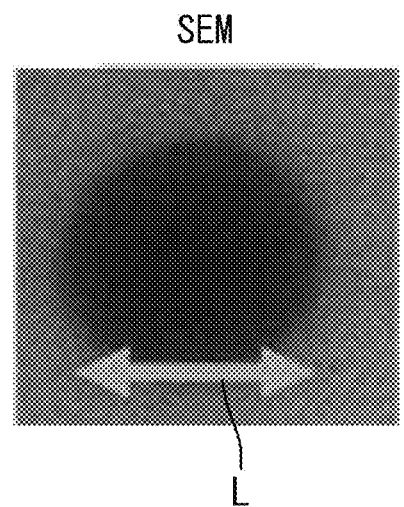
FIG. 7 is a view showing a scanning electron micrograph (SEM) image in which an impurity generated on a substrate that has been processed with a phosphoric acid liquid and rinsed are enlarged.

FIG. 7 is a view showing a scanning electron micrograph (SEM) image in which an impurity generated on a substrate that has been processed with the phosphoric acid liquid and rinsed is enlarged. A diameter L of the impurity generated on the substrate is about 1 μm.

Figure 8:
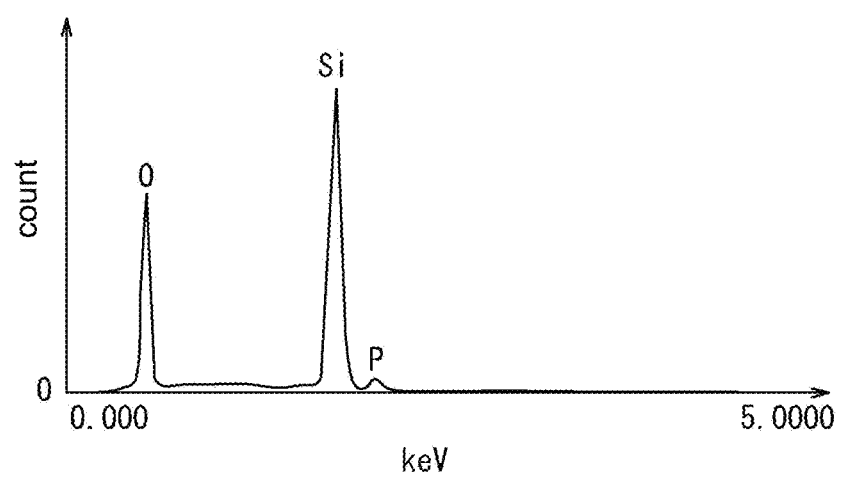
FIG. 8 is a graph showing a result in which impurities generated on the substrate that has been processed with a phosphoric acid liquid and rinsed are analyzed by energy dispersive X-ray spectrometry (EDX).

FIG. 8 is a graph showing a result in which impurities generated on the substrate are analyzed by an energy dispersive X-ray spectrometry (EDX). From the analysis result shown in FIG. 8, since not only silicon and oxygen but also phosphorus has been detected, it is understood that phosphorus is contained in the impurities.

Figure 9A:
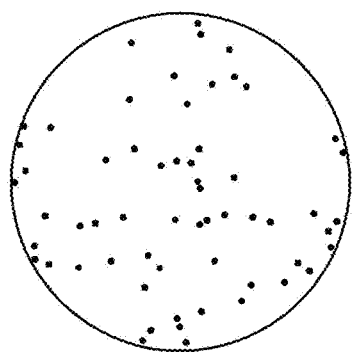
FIGS. 9A and 9B are schematic views showing a substrate after 6 hours and 24 hours have elapsed since the substrate was processed with a phosphoric acid liquid and rinsed.

Growth of impurities will be described with reference to FIGS. 9A and 9B. FIG. 9A is a schematic view showing the substrate after 6 hours have elapsed since the substrate was processed with the phosphoric acid liquid and rinsed. Further, FIG. 9B is a schematic view showing the substrate W after 24 hours have elapsed since the substrate was processed with the phosphoric acid liquid and rinsed.

Figure 9B:
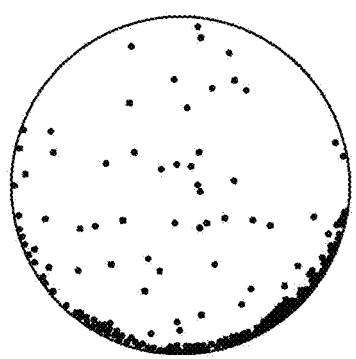

As can be understood from FIGS. 9A and 9B, the number of impurities increases with the elapse of time. Further, when 48 hours have elapsed since the substrate was processed with the phosphoric acid liquid and rinsed, impurities have grown to such an extent as to cover almost the whole of the substrate W.

These impurities are thought to be phosphate produced by phosphorus of the phosphoric acid liquid remaining on the substrate and absorbing moisture or other impurities in the air. Impurities were measured when they have a measurable size and increased with the elapse of time.

Figure 10A:
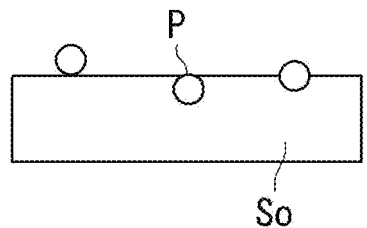
FIGS. 10A to 10C are schematic views illustrating a growth mechanism of impurities generated on a substrate processed with a phosphoric acid liquid.
Figure 10B:
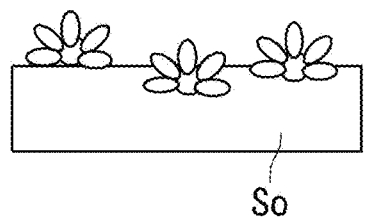
Figure 10C:
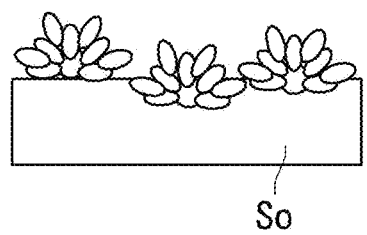

Here, a conceivable phosphorus growth mechanism will be described with reference to FIGS. 10A to 10C. FIGS. 10A to 10C are schematic views for explaining a growth mechanism of phosphorus.

As illustrated in FIG. 10A, when the substrate is processed with the phosphoric acid liquid, phosphorus P remains on the substrate even after the substrate is rinsed. In the phosphoric acid liquid processing, a surface of the silicon oxide film So of the substrate comes in contact with phosphoric acid, and residual phosphorus of the phosphoric acid liquid is present on the surface and near the surface of the silicon oxide film So.

As illustrated in FIG. 10B, when a phosphorus P on the surface of the silicon oxide film So is left as it stands, the phosphorus P absorbs moisture or the like in the air and grows. Thereafter, when the phosphorus P is left longer as it stands, the phosphorus P grows further as illustrated in FIG. 10C.

Further, as a method of removing phosphorus remaining on the substrate, a physical force such as air blowing or the like was applied to the substrate after the substrate was processed with the phosphoric acid liquid and rinsed, but generation of impurities could not be inhibited. On the other hand, when the oxide film on the surface of the substrate was removed by etching after the substrate was processed with the phosphoric acid liquid and rinsed, impurities were not generated on the substrate after the removal of the oxide film. From the above results, it is thought that the residual phosphorus of the phosphoric acid liquid is not adhering to the surface of the substrate, but diffuses near the surface of the substrate.

Here, results obtained when a standing time was changed after the wafer was processed with the phosphoric acid liquid and rinsed and then the wafer was processed with dilute hydrofluoric acid (DHF) are shown in Table 1. Here, the DHF was obtained by diluting 1 part by mass of hydrofluoric acid with 200 parts by mass of water, and a temperature thereof was 23° C. In addition, water was used as the rinsing liquid, and a temperature of the rinsing liquid was room temperature.

TABLE 1

| Number of particles | Standing time (hrs.) | | | | Thickness of film removed from substrate (nm) |
|---|---|---|---|---|---|
| | 0 | 16 | 24 | 48 | |
| DHF (sec.) 5 | 117 | NG | NG | NG | 0.11 |
| 10 | 132 | NG | NG | NG | 0.24 |
| 12 | 121 | NG | NG | NG | 0.27 |
| 13 | 115 | NG | NG | NG | 0.29 |
| 14 | 129 | 128 | 129 | 134 | 0.31 |
| 15 | 117 | 118 | 118 | 120 | 0.36 |
| 16 | 126 | 127 | 127 | 130 | 0.38 |
| 20 | 129 | 128 | 129 | 134 | 0.44 |
| 25 | 129 | 130 | 129 | 129 | 0.56 |
| 30 | 124 | 123 | 123 | 123 | 0.65 |

In Table 1, for example, when the substrate was processed with DHF for 5 seconds, a film with a thickness of 0.11 nm was removed from the substrate. In this case, when impurity particles on the substrate were measured without a standing time, 117 particles were confirmed in 40 nm square. Thereafter, when the substrate was checked after 16 hours standing time, particles increased by 50 or more as compared with the case of not having a standing time. Further, in Table 1, the standing time was changed as 0 hour, 16 hours, 24 hours, and 48 hours, and a case in which the number of particles increased by 50 or more compared to the number of particles at the previous standing time was described as "NG."

Further, in Table 1, when the substrate W was processed with DHF for 15 seconds, a film with a thickness of 0.36 nm was removed from the substrate. In this case, when the number of impurity particles on the substrate was measured without a standing time, 117 particles was confirmed in 40 nm square. Thereafter, when impurity particles on the substrate were left as they stood for 16 hours, 24 hours, and 48 hours, and each number of the impurity particles was checked, each number of the impurity particles per 40 nm square was 118, 118 and 120, and an increase in impurity particles was not confirmed.

From the results in Table 1, it is understood that when a processing time of DHF is increased, a thickness of the film removed from the substrate increases. Also, from the measurement results in Table 1, it is understood that when a film with a thickness of 0.3 nm or more is removed from the substrate, an increase in impurity particles can be inhibited. Further, in a case of processing with DHF, it was necessary to remove a film with a thickness of 0.31 nm or more from the substrate in order to inhibit an increase in impurity particles.

Next, results of processing the substrate with the phosphoric acid liquid, the rinsing liquid and the DHF are shown in Table 2. In Table 2, ionized distilled water at 70° C. was used as the rinsing liquid. The DHF was obtained by diluting 1 part by mass of hydrofluoric acid with 200 parts by mass of water, and a temperature thereof was 23° C. As in Table 1, a standing time was changed as 0 hour, 16 hours, 24 hours, and 48 hours. In Table 2, a case in which the number of particles increased by 50 or more compared to the number of particles at the previous standing time was described as "NG," and a case in which the number of particles has not increased by 50 or more compared to the number of particles at the previous standing time was described as "OK."

TABLE 2

| | | DHF | | |
|---|---|---|---|---|
| | | 5 sec. | 10 sec. | 15 sec. |
| 70C-DIW | 10 sec. | NG | NG | OK |
| | | 0.11 nm | 0.23 nm | 0.36 nm |
| | 30 sec. | NG | NG | OK |
| | | 0.12 nm | 0.24 nm | ND |
| | 60 sec. | NG | NG | OK |
| | | 0.16 nm | 0.25 nm | ND |
| | 90 sec. | NG | NG | OK |
| | | ND | 0.27 nm | ND |
| | 180 sec. | NG | OK | OK |
| | | 0.15 nm | 0.28 nm | ND |

As illustrated in Table 2, when the substrate was processed with the rinsing liquid for 10 seconds and then processed with hydrofluoric acid for 5 seconds, a thickness of a film removed from the substrate was 0.11 nm, and an increase in impurities was confirmed. Also, when the substrate was processed with the rinsing liquid for 10 seconds and then processed with hydrofluoric acid for 10 seconds, a thickness of the film removed from the substrate was 0.23 nm, and an increase in impurities was confirmed. On the other hand, when the substrate was processed with the rinsing liquid for 10 seconds and then processed with hydrofluoric acid for 15 seconds, a thickness of the film removed from the substrate was 0.36 nm. In this case, an increase in impurities was not confirmed.

Similarly, when the substrate was processed with the rinsing liquid for 30 seconds and then processed with hydrofluoric acid for 5 seconds, a thickness of the film removed from the substrate was 0.12 nm, and an increase in impurities was confirmed. Also, when the substrate was processed with the rinsing liquid for 30 seconds and then processed with hydrofluoric acid for 10 seconds, a thickness of the film removed from the substrate was 0.24 nm, and an increase in impurities was confirmed. On the other hand, when the substrate was processed with the rinsing liquid for 30 seconds and then processed with hydrofluoric acid for 15 seconds, a thickness of the film removed from the substrate could not be confirmed, and an increase in impurities was not confirmed.

Similarly, when the substrate was processed with the rinsing liquid for 60 seconds and then processed with hydrofluoric acid for 5 seconds, a thickness of the film removed from the substrate was 0.16 nm, and an increase in impurities was confirmed. Also, when the substrate was processed with the rinsing liquid for 60 seconds and then processed with hydrofluoric acid for 10 seconds, a thickness of the film removed from the substrate was 0.25 nm, and an increase in impurities was confirmed. On the other hand, when the substrate was processed with the rinsing liquid for 60 seconds and then processed with hydrofluoric acid for 15 seconds, a thickness of the film removed from the substrate could not be confirmed, but an increase in impurities was not confirmed.

Similarly, when the substrate was processed with the rinsing liquid for 90 seconds and then processed with hydrofluoric acid for 5 seconds, a thickness of the film removed from the substrate could not be confirmed, but an increase in impurities was confirmed. Also, when the substrate was processed with the rinsing liquid for 90 seconds and then processed with hydrofluoric acid for 10 seconds, a thickness of the film removed from the substrate was 0.27 nm, and an increase in impurities was confirmed. On the other hand, when the substrate was processed with the rinsing liquid for 90 seconds and then processed with hydrofluoric acid for 15 seconds, a thickness of the film removed from the substrate could not be confirmed, but an increase in impurities was not confirmed.

Further, when the substrate was processed with the rinsing liquid for 180 seconds and then processed with hydrofluoric acid for 5 seconds, a thickness of the film removed from the substrate was 0.15 nm, and an increase in impurities was confirmed. On the other hand, when the substrate was processed with the rinsing liquid for 180 seconds and then processed with hydrofluoric acid for 10 seconds, a thickness of the film removed from the substrate was 0.28 nm, and an increase in impurities was not confirmed. Also, when the substrate was processed with the rinsing liquid for 180 seconds and then processed with hydrofluoric acid for 15 seconds, a thickness of the film removed from the substrate could not be confirmed, but an increase in impurities was not confirmed.

From the results of Table 2, it is understood that, in a case of etching with hydrofluoric acid, when a thickness of the film removed from the substrate is 0.28 nm or more, an increase in impurities is not confirmed.

Next, results of processing the substrate with the phosphoric acid liquid, the rinsing liquid, the etchant, and the chemical liquid Lc are shown in Table 3. In Table 3, ionized distilled water at 70° C. was used as the rinsing liquid. DHF obtained by diluting 1 part by mass of hydrofluoric acid with 200 parts by mass of water was used as the etchant. A temperature of the DHF was 23° C. SC1 at 70° C. was used as the chemical liquid. Here, SC1 was a mixture of ammonium hydroxide, hydrogen peroxide, and water, and proportions of ammonium hydroxide, hydrogen peroxide and water was 1:2.77:70. Further, as in Table 1, a standing time was changed as 0 hour, 16 hours, 24 hours, and 48 hours. In Table 3, a case in which the number of particles has not increased by 50 or more compared to the number of particles at the previous standing time was described as "OK."

TABLE 3

|  |  | DHF | |
| --- | --- | --- | --- |
|  |  | 5 sec. | 10 sec. |
| 70C-SC1 | 16 sec. | OK | OK |
|  |  | 0.18 nm | 0.29 nm |
|  | 32 sec. | OK | OK |
|  |  | 0.22 nm | 0.33 nm |

As shown in Table 3, when the substrate was processed with hydrofluoric acid for 5 seconds and then processed with the SC1 for 16 seconds, a thickness of a film removed from the substrate was 0.18 nm. In this case, increase in impurities was not confirmed. Similarly, when the substrate was processed with hydrofluoric acid for 10 seconds and then processed with the SC1 for 16 seconds, a thickness of the film removed from the substrate was 0.29 nm. In this case, increase in impurities was not confirmed.

Also, when the substrate was processed with hydrofluoric acid for 5 seconds and then processed with the SC1 for 32 seconds, a thickness of the film removed from the substrate was 0.22 nm. In this case, increase in impurities was not confirmed. Similarly, when the substrate was processed with hydrofluoric acid for 10 seconds and then processed with the SC1 for 32 seconds, a thickness of the film removed from the substrate was 0.33 nm. In this case, increase in impurities was not confirmed.

From the above results, it is understood that an increase in impurities can be inhibited in a short processing time when the substrate is processed with hydrofluoric acid for 5 seconds and then processed with the SC1 for 16 seconds.

Further, as shown in Table 2, when the substrate was processed with hydrofluoric acid, impurities were generated even when an etching depth was 0.27 nm. On the other hand, as shown in Table 3, when the substrate was processed with hydrofluoric acid and then processed with the SC1, impurities were not generated even when an etching depth was 0.18 nm. It is known that etching continues to proceed when the substrate was processed with hydrofluoric acid, and etching of the substrate proceeds and a protective film is formed thereon when the substrate is processed with the SC1. Therefore, from a comparison between Table 2 and Table 3, it is recognized that the protective film formed when the substrate is processed with the SC1 contributes to inhibiting generation of impurities.

Here, changes of the substrate W when the substrate processing method of the present embodiment is executed will be described with reference to FIGS. 1, 2, and 11A to 11G. FIGS. 11A to 11G are schematic views illustrating changes of the substrate W when the substrate processing method of the present embodiment is executed.

Figure 11A:
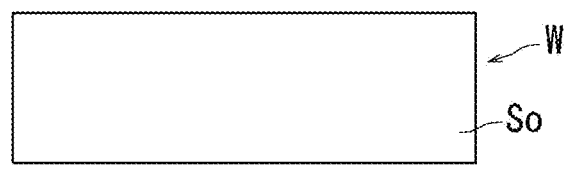
FIGS. 11A to 11G are schematic views illustrating changes of a substrate when the substrate processing method of the present embodiment is executed.

As illustrated in FIG. 11A, a substrate W is prepared. The substrate W has the silicon oxide film So provided at least in a partial region, and the silicon oxide film So is exposed on a surface thereof.

Figure 11B:
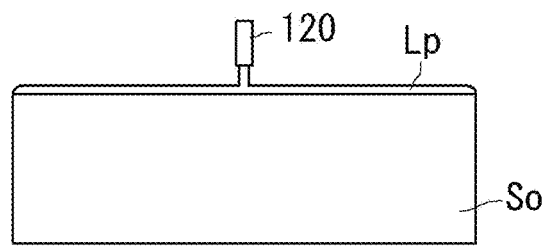

As illustrated in FIG. 11B, the substrate W is processed with the phosphoric acid liquid Lp. The phosphoric acid liquid Lp is supplied to the substrate W from the phosphoric acid liquid supply device 120.

Figure 11C:
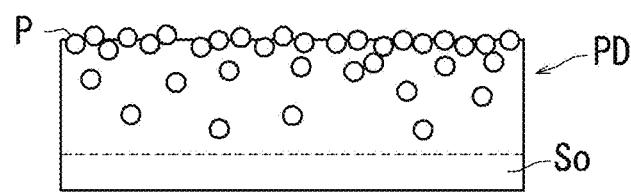

As illustrated in FIG. 11C, phosphorus remains on the substrate W after the substrate W is processed with phosphoric acid liquid. Further, the phosphorus diffuses not only on the surface of the substrate W but also into the vicinity of the surface of the substrate W. Due to the processing with the phosphoric acid liquid, as illustrated in FIG. 11C, the phosphorus diffusion region PD in which phosphorus has diffused is formed near the surface of the substrate W.

Figure 11D:
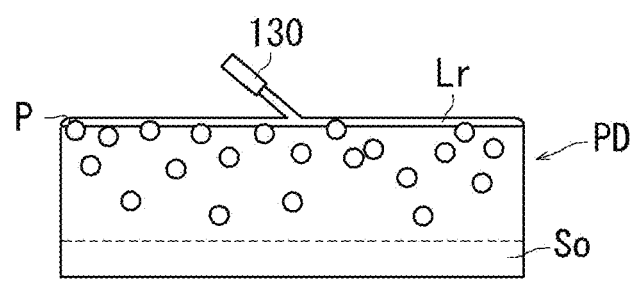

As illustrated in FIG. 11D, the substrate W is processed with the rinsing liquid Lr. The rinsing liquid Lr is supplied to the substrate W from the rinsing liquid supply device 130. Due to the processing with the rinsing liquid Lr, most of the phosphorus on the surface of the substrate W is removed. However, even after the rinsing processing, some of phosphorus on the surface of the substrate W remains, and phosphorus inside the substrate W near the surface remains.

Figure 11E:
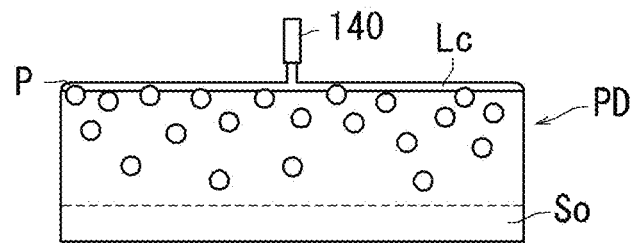

As illustrated in FIG. 11E, the chemical liquid Lc is supplied to the substrate W, and processing with the chemical liquid Lc on the substrate W is started. The chemical liquid Lc is a liquid containing ammonia, and the chemical liquid Lc is supplied to the substrate W from the chemical liquid supply device 140. By supplying the chemical liquid Lc, the substrate W is etched. Further, since the chemical liquid Lc is a liquid containing ammonia, strictly speaking, due to supply of the chemical liquid Lc, a protective film is formed on the surface of the substrate W and etching of the substrate W proceeds.

Figure 11F:
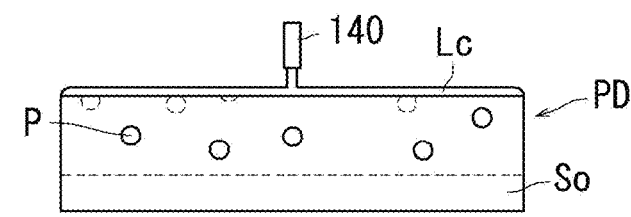

As illustrated in FIG. 11F, when the chemical liquid Lc is continuously supplied to the substrate W, the silicon oxide film So of the substrate W is etched. Further, the supply of the chemical liquid Lc ends before the chemical liquid Lc etches the whole of the phosphorus diffusion region PD.

Figure 11G:
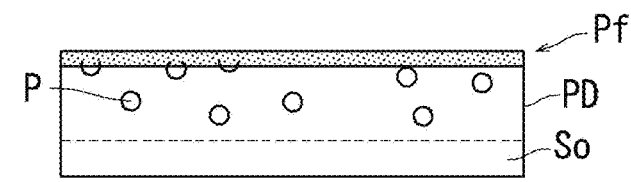

As illustrated in FIG. 11G, the protective film Pf is formed on the surface of the substrate W after the substrate W is processed with the chemical liquid Lc. Although the phosphorus still remains inside the surface of the substrate W after the substrate W is processed with the chemical liquid Lc, since an amount of the remaining phosphorus is small and the protective film Pf is formed, generation of impurities originating from the remaining phosphorus can be inhibited. The substrate processing method of the present embodiment is executed as described above.

Next, the substrate processing apparatus 100 of the present embodiment will be described with reference to FIG. 12. The substrate processing apparatus 100 of the present embodiment is different from the substrate processing apparatus 100 described above with reference to FIGS. 1 and 5 in that it includes a plurality of chambers 102. However, duplicate description will be omitted for the purpose of avoiding redundant description. Further, in FIGS. 1, 5, and 12, X axis, Y axis and Z axis perpendicular to each other are illustrated in order to facilitate understanding. The X axis and the Y axis are parallel in a horizontal direction, and the Z axis is parallel to a vertical direction.

Figure 12:
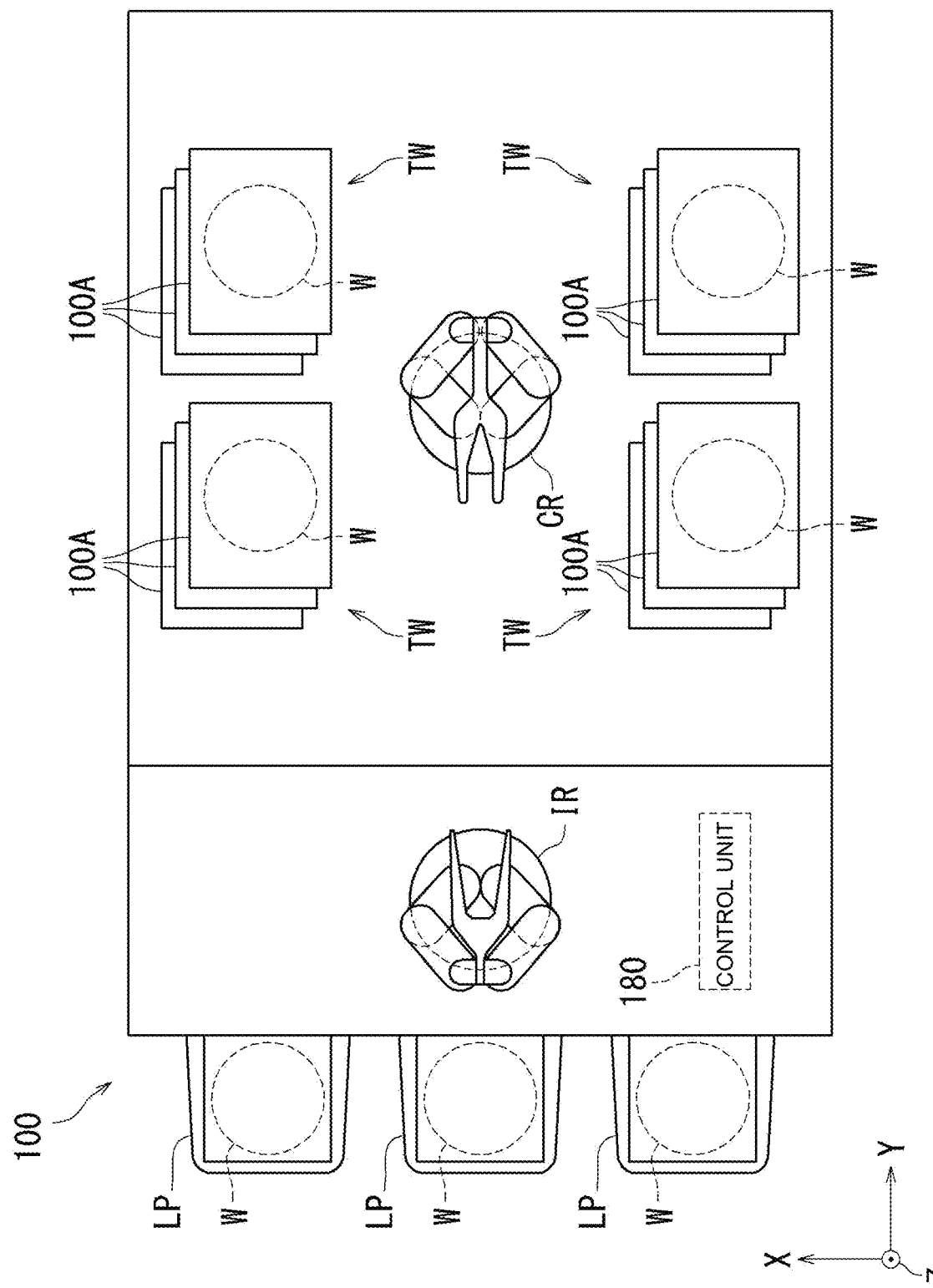
FIG. 12 is a schematic view illustrating a substrate processing apparatus of the present embodiment.

FIG. 12 is a plan view illustrating the substrate processing apparatus 100. As illustrated in FIG. 12, the substrate processing apparatus 100 includes a plurality of processing units 100A, a plurality of load ports LP, an indexer robot IR, a center robot CR, and a control unit 180. Each of the plurality of processing units 100A includes the chamber 102 and constituent components housed in the chamber 102 of the substrate processing apparatus 100 described above with reference to FIGS. 1 and 5. The control unit 180 controls the load ports LP, the indexer robot IR, the center robot CR, and respective constituent components of the plurality of processing units 100A. The control unit 180 includes a processor 182 and a storage unit 184.

Each of the load ports LP stacks and accommodates a plurality of substrates W. The indexer robot IR transfers the substrate W between the load ports LP and the center robot CR. The center robot CR transfers the substrate W between the indexer robot IR and the processing units 100A.

Specifically, the plurality of processing units 100A form a plurality of towers TW (four towers TW in FIG. 12) disposed to surround the center robot CR in a plan view. Each of the towers TW includes a plurality of processing units 100A (three processing units 100A in FIG. 12) stacked one above the other.

The embodiments (including modified examples) of the disclosure have been described with reference to the drawings. However, the disclosure is not limited to the above-described embodiments, and can be implemented in various modes without departing from the gist thereof. Further, various disclosures can be formed by appropriately combining a plurality of constituent elements disclosed in the embodiments described above. For example, some constituent elements may be deleted from all the constituent elements illustrated in the embodiments. Further, constituent elements of different embodiments may be appropriately combined. For ease of understanding, the drawings schematically illustrate respective constituent elements, and thicknesses, lengths, numbers, intervals, and the like of respective constituent elements illustrated in the drawings may differ from actual ones for convenience in producing drawings. Further, materials, shapes, dimensions, and the like of the respective constituent elements illustrated in the above embodiments are merely examples, and are not particularly limited, and various modifications are possible within a range that does not substantially deviate from effects of the disclosure.

Although the substrate processing apparatus 100 illustrated in FIGS. 1, 5, and 12 is of a single-wafer-processing type for processing the substrate W one at a time, the present embodiment is not limited thereto. The substrate processing apparatus 100 may be of a batch type that processes a plurality of substrates W at the same time.

In an embodiment of the disclosure, a substrate processing method is provided. The substrate processing method includes a step of processing the substrate with a phosphoric acid liquid, a step of processing the substrate with a rinsing liquid after the substrate has been processed with the phosphoric acid liquid, and a step of processing the substrate with a chemical liquid containing ammonia after the substrate has been processed with the rinsing liquid so that a portion of thickness of a film in a depth direction of a phosphorus diffusion region is removed from the phosphorus diffusion region formed in the substrate when the substrate is processed with the phosphoric acid liquid.

In the substrate processing method of an embodiment, the step of processing the substrate with the chemical liquid may include a step of removing a film with a thickness of less than 0.3 nm from a surface of the substrate.

In the substrate processing method according to an embodiment, the substrate processing method may further include a step of removing a portion of thickness of a film in a depth direction of the phosphorus diffusion region of the substrate after the substrate has been processed with the rinsing liquid and before the substrate is processed with the chemical liquid.

In the substrate processing method of an embodiment, an etching rate for etching the substrate with an etchant may be higher than an etching rate for etching the substrate with the chemical liquid.

In a substrate processing method according to an embodiment, a thickness of a film removed from the substrate by the etchant may be greater than a thickness of a film removed from the substrate by the chemical liquid.

In the substrate processing method of an embodiment, a temperature of the etchant is higher than a temperature of the chemical liquid.

In another embodiment of the disclosure, a substrate processing apparatus is provided. The substrate processing apparatus includes a phosphoric acid liquid supply device, a rinsing liquid supply device, a chemical liquid supply device, and a control unit. The phosphoric acid liquid supply device supplies a phosphoric acid liquid to the substrate. The rinsing liquid supply device supplies a rinsing liquid to the substrate. The chemical liquid supply device supplies a chemical liquid containing ammonia to the substrate. The control unit is configured to control the phosphoric acid liquid supply device, the rinsing liquid supply device, and the chemical liquid supply device. The control unit is configured to control the phosphoric acid liquid supply device so that the phosphoric acid liquid supply device supplies the phosphoric acid liquid to the substrate to process the substrate with the phosphoric acid liquid. The control unit is configured to control the rinsing liquid supply device so that the rinsing liquid supply device supplies the rinsing liquid to the substrate to process the substrate with the rinsing liquid after the substrate has been processed with the phosphoric acid liquid. The control unit is configured to control the chemical liquid supply device so that the chemical liquid supply device supplies the chemical liquid to the substrate after the substrate has been processed with the rinsing liquid to remove a portion of thickness of a film in a depth direction of a phosphorus diffusion region from the phosphorus diffusion region formed in the substrate when the substrate is processed with the phosphoric acid liquid.

In the substrate processing apparatus of another embodiment, the control unit may be configured to control the chemical liquid supply device so that a film with a thickness of less than 0.3 nm is removed from a surface of the substrate.

In the substrate processing apparatus according to another embodiment, the substrate processing apparatus may further include an etchant supply device that supplies an etchant to the substrate. The control unit may be configured to control the etchant supply device so that a portion of thickness of a film in a depth direction of the phosphorus diffusion region of the substrate is removed after the substrate has been processed with the rinsing liquid and before the substrate is processed with the chemical liquid.

In the substrate processing apparatus according to another embodiment, the control unit may be configured to control the etchant supply device and the chemical liquid supply device so that an etching rate for etching the substrate with the etchant is higher than an etching rate for etching the substrate with the chemical liquid.

In the substrate processing apparatus according to another embodiment, the control unit may be configured to control the etchant supply device and the chemical liquid supply device so that a thickness of a film removed from the substrate by the etchant is greater than a thickness of a film removed from the substrate by the chemical liquid.

In the substrate processing apparatus according to another embodiment, the control unit may be configured to control the etchant supply device and the chemical liquid supply device so that a temperature of the etchant is higher than a temperature of the chemical liquid.

What is claimed is:

1. A substrate processing method for processing a substrate, comprising:
   a step of processing the substrate with a phosphoric acid liquid;
   a step of processing the substrate with a rinsing liquid after the substrate has been processed with the phosphoric acid liquid;
   a step of processing the substrate with a chemical liquid containing ammonia after the substrate has been processed with the rinsing liquid so that a portion of thickness of a film in a depth direction of a phosphorus diffusion region is removed from the phosphorus diffusion region formed in the substrate when the substrate is processed with the phosphoric acid liquid; and
   a step of removing with an etchant a portion of thickness of the film in the depth direction of the phosphorus diffusion region of the substrate after the substrate has been processed with the rinsing liquid and before the substrate is processed with the chemical liquid.

2. The substrate processing method according to claim 1, wherein the step of processing the substrate with the chemical liquid comprises a step of removing the film with a thickness of less than 0.3 nm from a surface of the substrate.

3. The substrate processing method according to claim 1, wherein an etching rate for etching the substrate with the etchant is higher than an etching rate for etching the substrate with the chemical liquid.

4. The substrate processing method according to claim 3, wherein a thickness of the film removed from the substrate by the etchant is greater than a thickness of the film removed from the substrate by the chemical liquid.

5. The substrate processing method according to claim 1, wherein a temperature of the etchant is higher than a temperature of the chemical liquid.

6. The substrate processing method according to claim 1, wherein an oxide film and a nitride film are provided in the substrate, and the portion of the thickness of the film is a portion of the oxide film.

7. The substrate processing method according to claim 1, wherein the etchant is hydrofluoric acid.

* * * * *